United States Patent
Corrado et al.

(10) Patent No.: US 6,723,981 B2
(45) Date of Patent: Apr. 20, 2004

(54) SELF CONTAINED SENSING APPARATUS AND SYSTEM

(75) Inventors: Christopher Corrado, Hatfield, PA (US); George Rawa, Harleysville, PA (US); Carmin Quartapella, Schwenksville, PA (US); Timothy Edwards, Harleysville, PA (US)

(73) Assignee: Greene, Tweed of Delaware, Inc., Wilmington, DE (US)

( * ) Notice: Subject to any disclaimer, the term of this patent is extended or adjusted under 35 U.S.C. 154(b) by 0 days.

(21) Appl. No.: 10/349,614

(22) Filed: Jan. 23, 2003

(65) Prior Publication Data

US 2003/0127589 A1 Jul. 10, 2003

Related U.S. Application Data

(63) Continuation of application No. 10/171,192, filed on Jun. 12, 2002.
(60) Provisional application No. 60/301,557, filed on Jun. 28, 2001.

(51) Int. Cl.[7] ................................. H01J 40/14
(52) U.S. Cl. .................... 250/239; 414/222.01; 414/935
(58) Field of Search ................. 250/239, 306, 250/442.11, 492.2; 356/317, 237.2, 73; 414/222.01, 222.13, 935, 939

(56) References Cited

U.S. PATENT DOCUMENTS

| | | | |
|---|---|---|---|
| RE30,601 E | 5/1981 | Horr et al. | |
| 4,705,951 A | 11/1987 | Layman et al. | |
| 5,581,874 A | 12/1996 | Aoki et al. | |
| 5,790,750 A | 8/1998 | Anderson | |
| 5,853,572 A | 12/1998 | Kuennen et al. | |
| 5,946,083 A | 8/1999 | Melendez et al. | |
| 6,010,538 A | 1/2000 | Sun et al. | |
| 6,063,234 A | 5/2000 | Chen et al. | |
| 6,077,387 A | 6/2000 | Tesauro | |
| 6,111,248 A | 8/2000 | Melendez et al. | |
| 6,135,052 A | 10/2000 | Fujii et al. | |
| 6,200,023 B1 | 3/2001 | Tay et al. | |
| 6,222,337 B1 | 4/2001 | Kroeker et al. | |
| 6,244,121 B1 | 6/2001 | Hunter | |
| 6,468,816 B2 | 10/2002 | Hunter | |
| 6,532,403 B2 | 3/2003 | Beckhart et al. | |
| 2002/0078770 A1 | 6/2002 | Hunter | |
| 2002/0092369 A1 | 7/2002 | Hunter | |

FOREIGN PATENT DOCUMENTS

| | | |
|---|---|---|
| EP | 00941691 | 9/1999 |
| JP | 2135752 | 5/1990 |
| JP | 4167523 | 6/1992 |
| JP | 8285692 | 11/1996 |
| JP | 7142410 | 6/1999 |

Primary Examiner—David Porta
Assistant Examiner—Seung C. Sohn
(74) Attorney, Agent, or Firm—Akin Gump Strauss Hauer & Feld LLP

(57) ABSTRACT

A self contained sensing apparatus includes a housing establishing an interior compartment, the housing having a maximum thickness which is less than the size of a gate opening of a semiconductor wafer processing chamber for inserting the housing into the semiconductor wafer processing chamber for sensing a parameter. The housing includes a window extending through a principal housing surface. A sensor is provided within the housing and generally aligned with the window for sensing at least one parameter. A transmitter is provided within the housing and coupled with the sensor for receiving signals representative of the sensed parameter and transmitting the signals out of the housing.

12 Claims, 3 Drawing Sheets

SELF CONTAINED SENSING APPARATUS AND SYSTEM

CROSS-REFERENCE TO RELATED APPLICATIONS

This application is a continuation of application Ser. No. 10/171,192 filed Jun. 12, 2002 and entitled "Self Contained Sensing Apparatus and System" and claims the benefit of U.S. Provisional Patent Application No. 60/301,557, filed Jun. 28, 2001 and entitled "Self Contained Monitoring Apparatus and System For Use In A Harsh or Hostile Environment", the entire subject matter of which is hereby incorporated herein by reference.

BACKGROUND OF THE INVENTION

The present invention relates generally to a self contained sensing apparatus and system and, more particularly, to a self contained sensing apparatus for monitoring or measuring one or more parameters, performing visual inspections, calibration or otherwise obtaining information within a controlled environment, such as in a sealed semiconductor wafer processing chamber.

There are many situations in which it is desirable to have the ability to measure or monitor one or more parameters or to make visual inspections or calibration within a controlled environment which is not readily accessible. For example, it is desirable to have the ability to monitor one or more parameters, such as temperature, pressure, etc. within a controlled environment such as the environment within an operating semiconductor wafer processing chamber. The environment within such a semiconductor wafer processing chamber, particularly during the processing of semiconductor wafers, includes high vacuum pressures and low visibility. The use of existing, standard, monitoring equipment and/or techniques within such a semiconductor wafer processing chamber is ineffective because most existing monitoring equipment is not constructed to withstand the conditions present or to operate within the physical or dimensional constraints within such a semiconductor wafer processing chamber. The present invention overcomes the problems of the prior art by providing a self contained sensing apparatus for insertion into a controlled environment, such as the interior of a semiconductor processing chamber, for the purpose of monitoring or measuring one or more such parameters and/or performing visual inspections, calibration or otherwise obtaining information concerning features within the controlled environment. In a preferred embodiment, as described below, the present invention comprises a self contained apparatus for viewing the interior of a semiconductor wafer processing chamber for the purpose of inspection, calibration or other applications. The described viewing apparatus is of a particular size and shape which facilitates insertion of the apparatus into the semiconductor wafer processing chamber through an existing gate opening so as to preclude a significant disruption of any semiconductor processing which may be ongoing within the chamber. The described viewing apparatus is also particularly suited to be received within the robotic arm within the semiconductor wafer processing chamber to facilitate movement of the apparatus for viewing at various locations within the semiconductor processing chamber. The apparatus contains a transmitter for transmitting viewed images to a receiver outside of the semiconductor wafer processing chamber for receiving and displaying the viewed images in real time or near real time.

BRIEF SUMMARY OF THE INVENTION

Briefly stated, the present invention comprises a self contained sensing apparatus for sensing a parameter within the interior of a functioning semiconductor wafer processing chamber during the processing of semiconductor wafers, the chamber having a gate opening and a robot arm. The sensing apparatus comprises a housing having a maximum thickness which is less than the size of the gate opening for inserting the housing into the chamber through the gate opening. The housing includes a window extending through a principal housing surface. A sensor is located within the housing and is generally aligned with the window for sensing at least one parameter within the interior of the chamber during semiconductor wafer processing. A transmitter within the housing is coupled with the sensor for receiving signals representative of the sensed parameter and transmitting the signals out of the housing for analysis.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
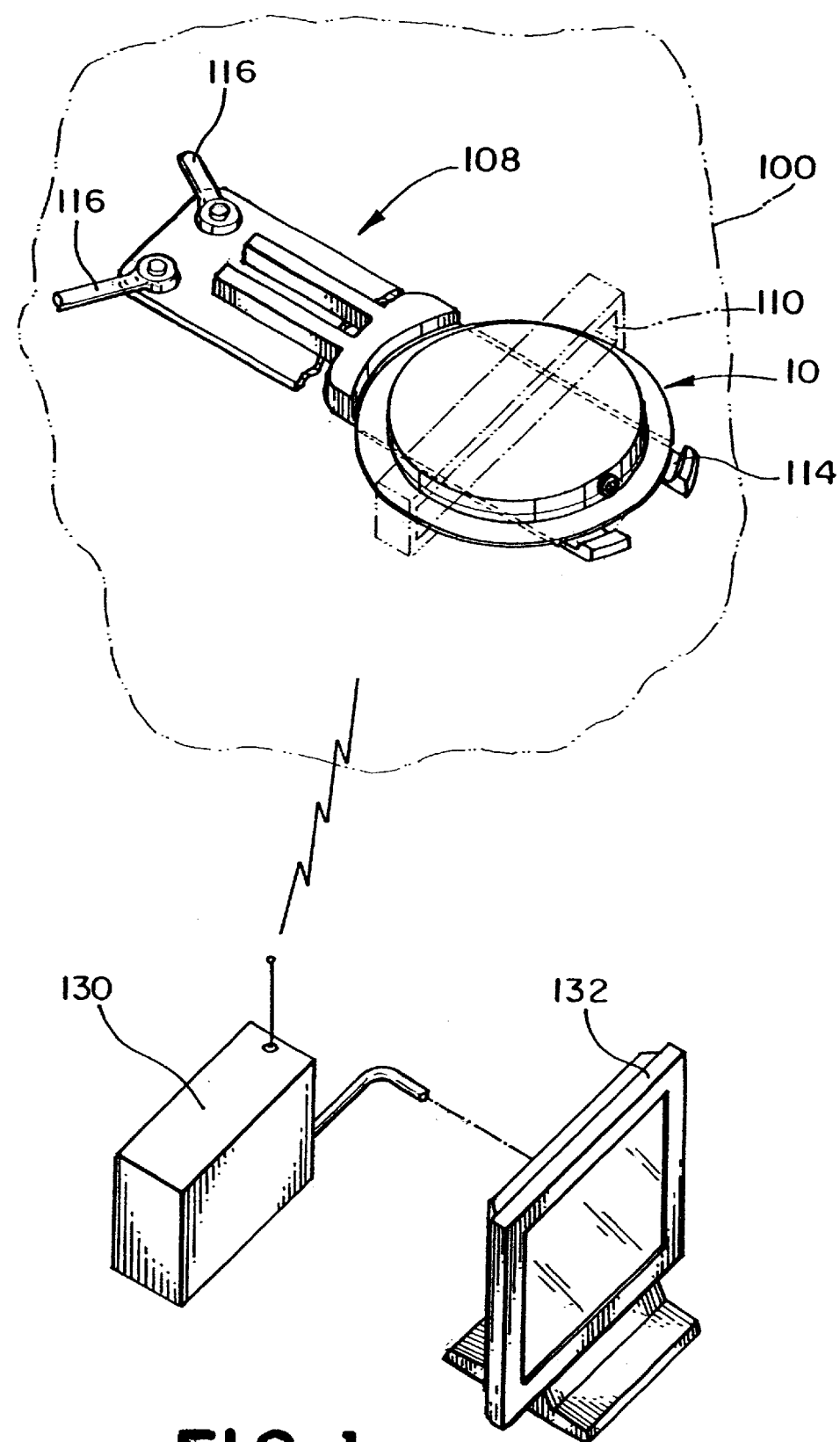
FIG. 1 is a perspective view of a preferred embodiment of a self contained sensing apparatus and system in accordance with the present invention.

Referring to the drawings, wherein like numerals are used to designate like components throughout the several figures, there is shown in FIGS. 1–8, a self contained sensing apparatus 10 in accordance with a first preferred embodiment of the present invention. The preferred embodiment of the sensing apparatus 10 as hereinafter described may be used for performing visual inspections, calibration or otherwise obtaining information from within a controlled environment. In the presently preferred embodiment, the controlled environment comprises a semiconductor wafer processing chamber 100 including a robotic arm assembly for wafer delivery.

The semiconductor wafer processing chamber 100, is a generally sealed environment which is formed of materials and methods well known to those of ordinary skill in the art. Contained within the chamber 100 are the equipment and components (not shown), which are necessary for establishing the environment required for processing semiconductor wafers. Such equipment and components are also well known to those of ordinary skill in the art and further details regarding the structure and operation of such equipment and components are not necessary for a complete understanding of the present invention. One such component which is contained within the chamber 100 is a robotic arm assembly 108, which is primarily employed for the purpose of transferring semiconductor wafers into an out of the chamber 100 through a suitable slot-like sealed doorway referred to as a gate opening 110. The robotic arm assembly 108, often referred to as a robot arm, is comprised of a base member (not shown), a wafer holding assembly 114 and supporting linkage members 116 which are employed for moving the remainder of the robotic arm assembly 108 to and at least partially through the gate opening 110 and to various locations within the chamber 100 to facilitate processing of the semiconductor wafers. The robotic arm assembly 108 is of a type well known to those of ordinary skill in the semiconductor wafer processing art. Further details concerning the structure and operation of the robotic arm assembly 108 are not necessary for a complete understanding of the present invention.

The foregoing description relates to a semiconductor wafer processing chamber 100 of a type well known to those of ordinary skill in the semiconductor wafer processing art. Such chambers 100 are commercially available from several well known manufacturers, including Applied Materials, Inc. Further details regarding the structure and operation of the chamber 100 are available from the various manufacturers and a variety of publicly available sources and are not necessary for a complete understanding of the present invention. It is also understood by those of ordinary skill in the art that during a semiconductor wafer processing operation, the interior of a semiconductor wafer processing chamber 100 of the type described and shown is maintained at a temperature in the range of 60–400° C. and is subjected to vacuum pressures in the range of $10^{-7}$ Torr, thereby creating an environment which effectively precludes the use of standard, unprotected sensing or monitoring equipment and techniques, including standard video cameras or other unprotected viewing equipment. The inability to effectively use such sensing equipment and techniques within such a semiconductor wafer processing chamber 100 makes it more difficult to fully know the values of certain parameters within the chamber 100 at various times during the processing of semiconductor wafers, which are desirable to better control the processing of the semiconductor wafers. The present invention overcomes the difficulties associated with the prior art by providing a self contained sensing apparatus 10 for measuring or monitoring one or more parameters or obtaining visual images from within a semiconductor wafer processing chamber 100 during the processing of the semiconductor wafers and for transmitting the information obtained to equipment outside of the semiconductor processing chamber 100 for analysis by an operator.

It should be clearly understood by those of ordinary skill in the art that while in the embodiment described below and shown in the drawings, the self contained sensing apparatus 10 is particularly well suited for use in measuring or monitoring parameters or making visual inspections within a semiconductor wafer processing chamber 100, this is but one of many uses for a self contained sensing apparatus 10 in accordance with the present invention. It should also be clearly understood by those of ordinary skill in art that while the below described embodiment of the self contained sensing apparatus 10 specifically relates to the sensing of visual images using an optical sensor, the invention is not limited to visual or optical sensing but is also applicable to the sensing of other parameters including pressure, temperature, air content, humidity or other environmental factors, spectrographic analysis or other analysis of chemical composition and the like. It will also be appreciated by those of ordinary skill in the art that more than one sensor or more than one type of sensor may be employed within the self contained sensing apparatus 10 for a particular application. Thus, it should be clearly understood that the present invention is not limited to the particular optical sensor described below and shown in the drawings nor is the present invention limited to use of the sensing apparatus in a particular environment, such as the interior of a semiconductor wafer processing chamber 100 as described herein.

The self contained sensing apparatus 10 is comprised of a housing 12 establishing an interior compartment 14 for purposes which will hereinafter become apparent. The housing 12, in the present embodiment, is comprised of a generally flat base member 16 having a first principal surface 16*a*, a second principal surface 16*b* and a first predetermined thickness T1. In the present embodiment, the base member 16 is generally circular and includes a central axis 18. Preferably, the circumference of the base member 16 is generally the same as or smaller than the circumference of a semiconductor wafer of the type which may be processed within the semiconductor wafer processing chamber 100 and preferably the base member 16 is in the range of 6 to 18 inches in diameter. As best shown on FIGS. 2 and 4, the first surface 16*a* of the base member 16 is generally flat and includes a pair of thin, generally parallel, spaced apart outwardly extending flange members 20 with a chamfered area 22 generally in the shape of a truncated circle therebetween. The parallel flange members 20 and the chamfered area 22 are provided to permit the first surface 16*a* of the base member 16 to interface with complimentary shaped features on the surface of the wafer holding assembly 114 of the robot arm 108 within the semiconductor wafer processing chamber 100 to facilitate orienting the sensing apparatus 10 with respect to the robot arm 108 when the sensing apparatus 10 is installed on the wafer holding assembly 114 (see FIG. 1) and to help hold the sensing apparatus 10 in place as it is moved by the robot arm 108 into, out of and to locations within the chamber 100. If desired, other structural features may be incorporated into or extend from the first surface 16*a* of the base member 16 to facilitate proper orientation and interfacing of the sensing apparatus 10 with the robot arm 108.

Figure 3:
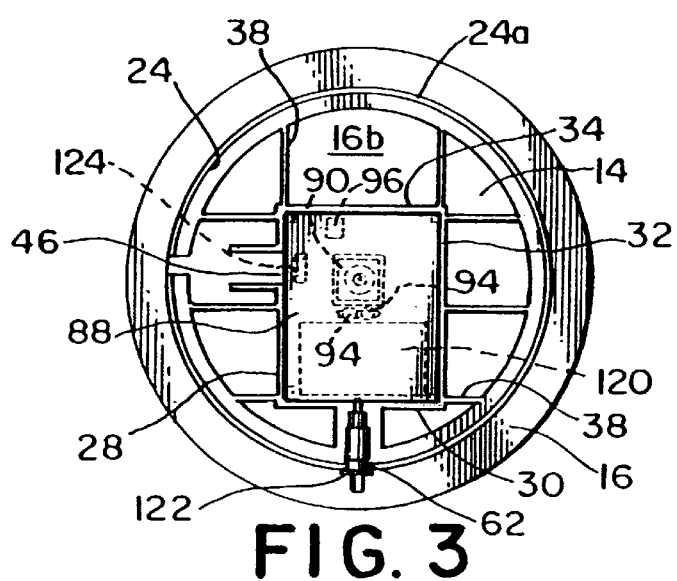
FIG. 3 is a sectional view taken along line 3—3 of FIG. 2.
Figure 4:
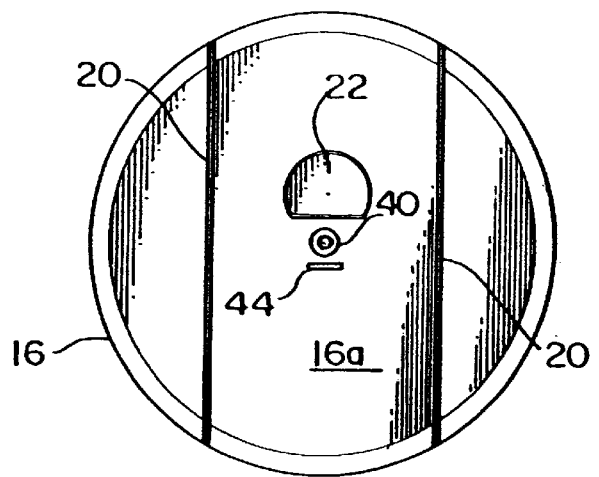
FIG. 4 is a sectional view taken along line 4—4 of FIG. 2.
Figure 5:
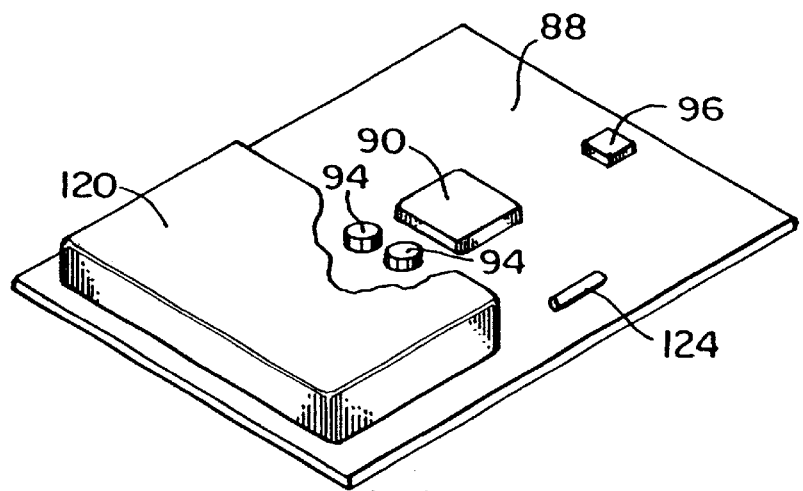
FIG. 5 is a perspective view of a printed circuit board of the sensing apparatus of Fig. 1.
Figure 6:
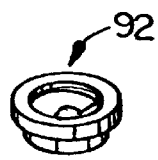
FIG. 6 is a perspective view of a lens and holder assembly of the sensing apparatus of Fig. 1.
Figure 7:
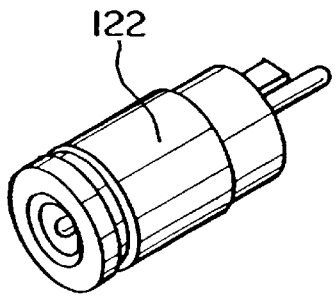
FIG. 7 is a perspective view of a charging jack of the sensing apparatus of FIG. 1.
Figure 8:
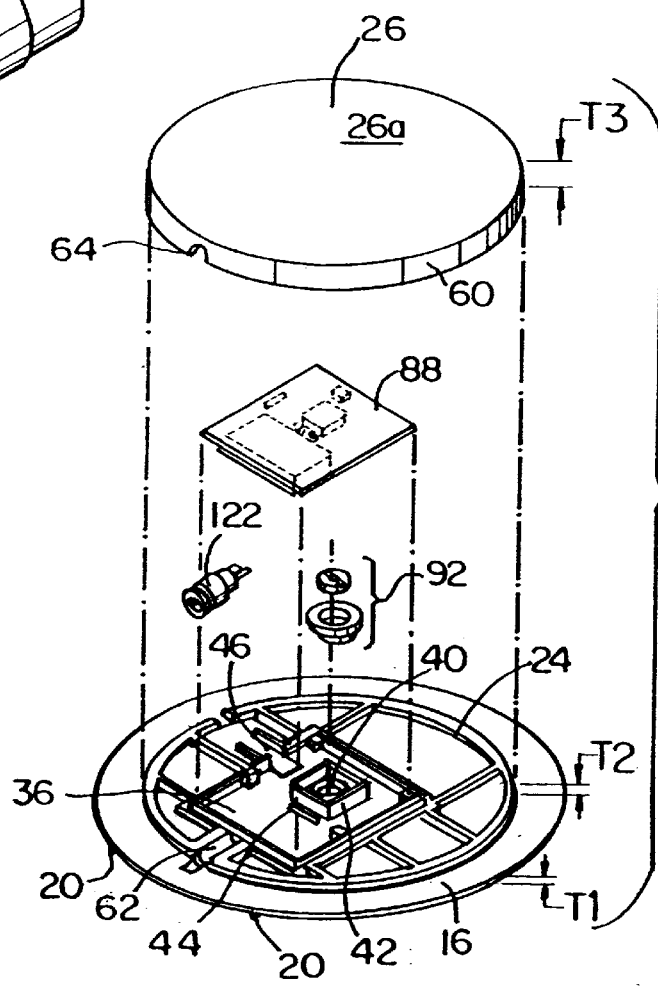
FIG. 8 is an exploded perspective view of the sensing apparatus of FIG. 1.

As best shown in FIGS. 3 and 8, a first, generally annular flange member 24 extends from the generally flat second surface 16*b* of the base member 16. The first annular flange member 24 is generally coaxial with the base member 16 and includes an outer dimension which, in the present embodiment, is established by the outer circumference of the first annular flange member 24 and which is less than the circumference of the base member 16. The first annular flange member 24 includes a distal surface 24*a* and has a second predetermined thickness T2.

Figure 2:
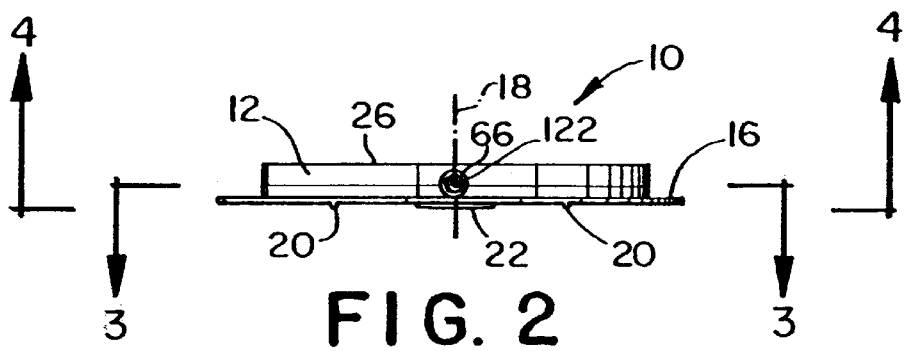
FIG. 2 is a side elevational view of the sensing apparatus of FIG. 1.

As best shown in FIGS. 2 and 8, the housing 12 further includes a generally flat cover member 26 which, in the present embodiment, is generally circular having an outer dimension or circumference which is at least as great as and preferably the same as the outer circumference of the first annular flange member 24. The cover member 26 has a first principal surface 26*a*, a second principal surface and a third predetermined thickness T3. As best shown in FIG. 2, the second surface of the cover member 26 engages the distal surface 24*a* of the first annular flange member 24 to establish, with the first annular flange member 24 and the base member 16 the interior compartment 14. In the present embodiment, when the housing 12 is assembled, the first, second and third predetermined thicknesses T1, T2 and T3 combine to establish a maximum thickness of the housing 12. Preferably, the maximum thickness of the housing 12 is less than the size of an access portal to an area within which sensing is to take place, in the present embodiment the gate opening 110 of the semiconductor wafer processing chamber 100, to facilitate inserting the housing 12 into the semiconductor wafer processing chamber 100 or into some other area for performing the desired sensing. It is important that the self contained sensing apparatus 10 have the ability to be inserted into and removed from the semiconductor wafer processing chamber 100 through the gate opening 110 or from any such other area within which sensing is desired in order to permit the sensing apparatus 10 to perform the desired sensing task(s) without disrupting or unduly affecting the environment within the semiconductor wafer processing chamber 100 or other area for sensing.

As best shown in FIGS. 3 and 8, the second surface 16b of the base member 16 includes four additional flange members 28, 30, 32, 34, which together form a subcompartment 36 within the housing 12. In the presently preferred embodiment, the flange members 28, 30, 32 and 34 are generally of the same thickness, have two different lengths and are generally perpendicular to each other so that the subcompartment 36 is generally rectangular. It will be appreciated by those of ordinary skill in the art that the subcompartment 36 may be of some other shape, if desired. The subcompartment 36 is established for the purpose of receiving and retaining a printed circuit board 88 in a manner which will hereinafter be described.

The second surface 16b of the base member 16 further includes a plurality of generally parallel and generally perpendicular reinforcing members or ribs 38 at spaced locations between the inner circumference of the first annular flange member 24 and the flange members 28, 30, 32 and 34 which form the subcompartment 36 to provide additional rigidity to the base member 16 in a manner well known to those of ordinary skill in the art. The base member 16 further includes an opening or port which extends completely through the base member 16 from the first surface 16a to the second surface 16b for the purpose of establishing a viewing window 40. In the present embodiment, the window 40 is generally circular and is coaxial with the base member 16, i.e., the window 40 extends through the axial center of the base member 16. It will be appreciated by those of ordinary skill in the art that the window 40 need not be circular and need not extend through the axial center of the base member 16, if desired. In the present embodiment, the window 40 is generally open. However, in other applications, the window 40 may be covered or enclosed with a protective material. The protective material, which is preferably transparent, may be generally flat and formed of a substance which is resistant to abrasion, scoring and other conditions present in the environment within which the self contained sensing apparatus 10 may be operating but which also has lens quality, high light transmission, particularly in the infrared, visible and ultraviolet ranges. Such materials may include synthetic sapphire, particularly a single crystal synthetic sapphire, glass, quartz, a polymeric material or any other suitable light transmissive material resistant to the particular environment within which the sensing apparatus 10 may be operating. If desired, additional windows (not shown) could be provided at other locations of the housing 12.

In the present embodiment, a generally square boss 42 generally surrounds the window 40 on the second surface 16b of the base member 16. In addition, a second, smaller, generally elongated, oval shaped opening 44 extends through the base member 16 within the subcompartment 36 at a location slightly spaced from one side of the boss 42. Further, an opening 46 extends through the flange member 28. The purposes of the boss 42 and the openings 44 and 46 will hereinafter be described.

The second surface of the cover member 26 also includes four flange members, which are arranged in substantially the same manner as the flange members 28, 30, 32 and 34 of the base member 16. In this manner, when the cover member 26 is installed as shown in FIG. 2, the flange members on the second surface of the cover member 26 align with the corresponding flange members 28, 30, 32 and 34 on the second surface 16b of the base member 16 to effectively establish the subcompartment 36 for receiving and retaining the printed circuit board 88 as will hereinafter be described. One of the flange members of the cover member 26 includes an opening extending therethrough. The second surface of the cover member 26 also includes a plurality of reinforcing members or ribs to provide additional rigidity. The second surface of the cover member 26 further includes a second generally annular flange member 60 in a location generally aligned with the first annular flange member 24 of the base member 16, in this embodiment corresponding to the outer circumference of the cover member 26. The first annular flange member 24 and the second flange member 60 each include generally semicircular shaped openings 62 and 64 which are generally aligned with each other so that when the cover member 26 is installed on the base member 16, a generally circular opening 66 is established. A second pair of openings extend through the first and second annular flange members 24 and 60 generally aligned with each other to establish a second generally circular opening when the cover member 26 is installed on the base member 16.

When the cover member 26 is installed on the base member 16 the first and second annular flange member 24 and 60 align with each other to establish the interior compartment 14. The openings extend through the annular flange members 24 and 60 to provide access to the subcompartment 36 for purposes which will hereinafter be described. In the preferred embodiment, the maximum thickness of the housing (established by the combination of T1, T2 and T3) is less than the thickness of the gate opening 110 in the semiconductor wafer processing chamber 100 and preferably is less than one half of an inch thick. In the presently preferred embodiment, the maximum thickness of the housing 12 is about 0.35 inch. For purposes of measuring parameters or sensing images within the semiconductor wafer chamber 100 the interior compartment 14 need not be sealed or gas tight. However, in other applications, it may desirable to have a gas tight or sealed interior compartment.

Preferably, the base member 16 and the cover member 26 (and all of the associated components thus far described) are formed of a generally rigid polymeric material. However, it will be appreciated by those of ordinary skill in the art that the base member 16 and the cover member 26 may be formed of any other suitable structurally sound, non-warping, preferably light weight, resilient material which is resistant to the environment in which the sensing apparatus 10 may be used. The material may be gas impervious and capable of forming a gas tight seal in some applications. Materials which may be employed include ferrous metals and alloys, non-ferrous metals and alloys, ceramics, polymeric materials such as thermoplastic or thermoset polymeric materials and composite materials such as glass, aramid or carbon fiber thermoplastics. In some applications, the base member 16 and associated components may be made of a first material and the cover member 26 and associated components may be made of a second material as long as the housing 12 remains structurally sound, non-warping and provides sufficient protection for components (hereinafter described) contained within the interior compartment 14. The base member 16 and the cover member 26 may be made utilizing known material forming techniques including casting, molding, machining, etc. or any combination of such techniques. Preferably, the cover member 26 is secured to the base member 16 utilizing a snap in engagement of a type well known to those of ordinary skill in the art supplemented with an adhesive, preferably an ultraviolet curable adhesive also well known to those of ordinary skill in the art. Alternatively, the cover member 26 may be secured to the base member 16 utilizing suitable mechanical fasteners, such as screws or bolts (not shown) or in any other suitable manner including thermal welding, brazing, some other type of clamp or fastener or using some other type of adhesive. Thus, the present invention is not limited to the use of a particular manner or technique for fastening the cover member 26 to the base member 16.

The housing 12 as thus far described is conveniently sized and shaped to be received within a robot arm 108 or other suitable movement device located within a semiconductor wafer processing chamber 100 for the purpose of moving the sensing apparatus 10 into and out of the chamber 100 through the existing gate opening 110 and to selected locations to facilitate visual inspection, calibration and/or monitoring or measuring at any desired location within the processing chamber 100. This is an important feature because it permits the insertion, removal and movement of the sensing apparatus 10 without having to breakdown or open the semiconductor processing chamber 10 and without having to disrupt, in any significant manner, the processing of semiconductor wafers. In the present embodiment, the housing 12 is not air tight or otherwise sealed. However, in other applications, the interior compartment 14 may be sealed or encapsulated to provide enhanced protection for the components contained therein. In some applications, the interior compartment 14 may include thermal insulation (not shown) or a coolant (not shown) and/or EMI shielding (not shown) to further protect the components contained therein. Thus, it should be clearly understood that the size, shape and configuration of the housing 12 as shown and described is merely for a single preferred embodiment of the sensing apparatus 10 for use in a semiconductor wafer processing chamber 100. It will be apparent to those of ordinary skill in the art that the size, shape and configuration of the housing 12 could vary substantially from what is shown and described, particularly for other applications. Therefore, the present invention is not limited to a sensing apparatus 10 having the above-described housing 12.

The interior compartment 14 and, particularly the subcompartment 36 contains the various components and subassemblies, which together form the operational aspects of the sensing apparatus 10, which are collectively referred to as the sensor assembly. The sensor assembly includes three principal subassemblies, a sensor subassembly, a transmitter subassembly and a power source subassembly. In the present embodiment, each of the principal subassemblies are mounted on or otherwise secured to a substrate, in the present embodiment a printed circuit board 88, which is of a type well known to those of ordinary skill in the art. In the present embodiment, the printed circuit board 88 is generally rectangular and is sized to be received and retained within the subcompartment 36 when the housing 12 is assembled.

In the present embodiment, the sensor subassembly includes an optical sensor for sensing images through the window 40 extending through the base member 16 of the housing 12. In the present embodiment, the optical sensor comprises a high efficiency, low voltage CMOS sensor 90, which functions as a single chip video camera. The CMOS sensor 90, in the present embodiment, is of the VGA type which is PAL/NTSC and SEcam compatible and comprises 640×480 pixels in EIA TV standard format. The CMOS sensor 90 is secured to the printed circuit board 88 at a central location so that when the printed circuit board 88 is installed within the subcompartment 36, the CMOS sensor 90 extends into and is surrounded by the square boss 42 (see FIG. 3), which surrounds the window 40 extending through the base member 16 of the housing 12. A lens and lens holder 92 are also located and retained within the square boss 42 such that the lens is located between the CMOS sensor 90 and the window 40. Preferably, the lens is of the planoconvex type and includes an appropriate focal length to provide sufficient visual clarity within the desired range of operation of the CMOS sensor 90. It will be apparent to those of ordinary skill in the art that different lenses may be employed for different applications. For example, in some applications, a telescoping lens may be employed whereas in other applications a rotational prism lens may be employed. Accordingly, the precise type of lens employed and/or its focal length should not be considered to be a limitation on the present invention. In the present embodiment, the CMOS sensor 90 is generally square with outer dimensions, which closely correspond to the inner dimensions of the square boss 42. In this manner, when the printed circuit board 88 is installed within the subcompartment 36 with the CMOS sensor 90 extending into the square boss 42, the square boss 42 blocks extraneous light (i.e., light received other than through the window 40) from entering either the lens or the CMOS sensor 90.

The sensor subassembly also includes a pair of light emitting diodes (LEDs) 94, which are secured to the printed circuit board 88 a short distance from the CMOS sensor 90. The LEDs 94 are located on the printed circuit board 88 so that when the printed circuit board 88 is installed within the subcompartment 36, the LEDs 94 are aligned with the elongated, oval-shaped opening 44 extending through the housing base member 16. In this manner, when the LEDs 94 are lit, light from the LEDs 94 shines through the elongated oval opening 44 to illuminate the viewing area of the CMOS sensor 90. In the present embodiment, the LEDs 94 are of the infrared type and provide sufficient illumination of the area within the focal length of the lens and CMOS sensor 90. It will be appreciated by those of ordinary skill in the art that other types of LEDs may be employed if desired or, if desired, some other lighting source may be provided. It will also be appreciated by those skilled in the art that in some applications less than or more than two LEDs or no lighting source may be needed.

It will be appreciated that while, in the present embodiment, a CMOS sensor 90 is employed for sensing the visual images, other types of cameras or visual sensors could alternatively be employed including cameras of the SVGA, XGA or MEGA pixel type. If desired, multiple cameras of differing types of resolution could be employed with lenses of varying types and focal lengths. The camera could be of a static (still) or dynamic (video) type and could either be of the charged coupled device (CCD) type, if desired. In addition, the camera chip or CMOS sensor 90 could be used to output a video signal in any standard TV format.

The transmitter subassembly includes a transmitter 96 and an associated antenna (not shown). In the present embodiment, the transmitter 96 is of the standard FM type and includes a voltage controlled oscillator (VCO). Preferably, the transmitter operates in the 2.4 to 2.5 giga-Hertz microwave channel, which is generally known as the "Blue Tooth" channel. The 15 video signal output from the CMOS sensor 90 is preconditioned utilizing standard conditioning circuitry and is fed into the input of the transmitter 96 for transmission out of the housing 12 utilizing the antenna. Preferably, the antenna is of the directional tuned type and is incorporated into the printed circuit board 88 but any other suitable antenna could be used. Further details concerning the structure and operation of the transmitter 96 and antenna are well known to those of ordinary skill in the art and are not necessary for a complete understanding of the present invention. It will be appreciated by those of ordinary skill in the art that any other suitable type of transmitter and antenna combination may alternatively be employed as long as the transmitter and antenna are compatible with the conditioned video signals received from the CMOS sensor 90 for transmission out of the housing 12. It will also be appreciated by those of ordinary skill in the art that the transmitter 96 may operate in some other frequency range, if desired. Alternatively, some other type of transmitter, such as an infrared transmitter, could be employed.

The power source subassembly includes a battery 120, which is secured to the printed circuit board 88 and associated circuit components (not shown). In the present embodiment, the battery 120 is of the lithium ion type with a nominal voltage in the range of 3.7 volts. The battery 120 is also preferably of the rechargeable type and may be recharged without removing the battery 120 from the housing 12. For this purpose, a charging jack 122 is connected to the battery 120 and/or its associated circuitry. The charging jack 122 is installed within the opening 66 extending through the first and second annular flange members 24 and 60 as described above. In this manner, the distal end of the charging jack 122 may be conveniently accessed from outside of the housing 12 to facilitate charging of the battery 120. Associated with the battery 120 is the usual protection circuitry (not shown), including circuitry to preclude short circuits, to minimize discharging of the battery and to facilitate the use of the charging jack 122. A voltage regulator (not shown) of the type well known to those of ordinary skill in the art is also provided. The battery 120 and associated circuitry provides power at the required voltage levels for all of the other components on the printed circuit board 88. While in the present embodiment, the battery 120 is of the lithium ion type, it will be appreciated by those of ordinary skill in the art that other types of rechargeable batteries may be alternatively employed including a silver oxide battery, a lithium metal halide battery, a Ni-CAD battery or an alkaline battery. Further, although in the present embodiment, the battery 120 is of the rechargeable type, a non-rechargeable battery may be used in some applications. In addition, while in the presently preferred embodiment, recharging of the battery 120 is accomplished by physically connecting a charger (not shown) to the charging jack 122, other methods may be employed for recharging the battery including utilizing a charge coupled coil, photovoltaic cells or some other method or technique known to those of ordinary skill in the art.

The power source subassembly further includes an on/off switch to power down the other subassemblies and thereby save battery life when the sensing apparatus 10 is not in use. In the present embodiment, the on/off switch comprises a standard magnetically actuated reed switch 124 connected between the power source subassembly 86 and the other components on the printed circuit board 88. The reed switch 124 is located on the circuit board 88 so as to be next to the opening 46 in the subcompartment 36 and generally aligned with openings of the first and second annular flange members 24 and 60. In this manner, a small magnet (not shown) may be moved into the housing 12 through the associated openings to change the state of the magnetically actuated reed switch 124. In the presently preferred embodiment, the close proximity of the magnet to the magnetically actuated reed switch 124 causes power to be applied to the various components on the printed circuit board 88 and the absence of the magnet results in no power being applied to any of the components. It will be appreciated by those of ordinary skill in the art that other types of on/off switching devices may alternatively be employed.

The sensing apparatus 10 is assembled by first placing the printed circuit board within the subcompartment 36 so that the CMOS sensor 90 and its associated lens are within the square boss 42 with the LEDs 94 aligned with the elongated oval-shaped opening 44. The battery jack 122 is positioned within the circular opening 66. The cover member 26 is then placed over the base member 16 with the various features aligned as described above.

As shown in FIG. 1, a receiver 130 is provided for receiving the signals transmitted by the transmitter 96 and antenna. Preferably, the receiver 130 is located outside of the semiconductor wafer processing chamber 100 but within the reception range of the transmitter 96. In the present embodiment, the receiver 130 is a four channel 2.4–2.5 gigaHertz FM type receiver of a type well known to those of ordinary skill in the art and adapted for receiving transmissions from the transmitter 96. The receiver 130 in turn is connected to a monitor 132, which preferably is of the flat screen type and is fully compatible for reception and display of signals generated by the CMOS sensor 90. Preferably, the monitor 132 is of the VGA type but other types of compatible monitors may alternatively be employed. In this manner, images sensed by the CMOS sensor 90 are transmitted out of the housing 12 by the transmitter 96 and antenna where they are received by the receiver 130, demodulated and sent to the monitor 132 for display and viewing by an operator. It will be apparent by those of ordinary skill in the art that other types of receivers and/or types of monitor devices may alternatively be employed in a particular application. For example, the monitor could comprise a personal computer, laptop computer, notebook computer, PDA, cellular phone or any other electronic device which includes data acquisition software for receiving and displaying the demodulated video signals. Further, the receiver 130 and monitor 132 may be integrated as a single unit. The monitor 130 could include a liquid crystal display device or any other suitable type of display known to those of ordinary skill in the art. If desired, a printer (not shown) could be associated with the monitor 132 for providing a more permanent record of images captured by the CMOS sensor 90.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A self contained sensing apparatus for sensing a parameter within the interior of a functioning semiconductor wafer processing chamber during the processing of semiconductor wafers, the chamber having a gate opening and a robot arm, the sensing apparatus comprising:

a housing establishing an interior compartment, the housing having a maximum thickness which is less than the size of the gate opening so that the housing may be inserted into the chamber through the gate opening, the housing including a window extending through a principal housing surface;

a sensor within the housing and generally aligned with the window for sensing a parameter within the interior of the chamber during semiconductor wafer processing; and a transmitter within the housing coupled with the sensor for receiving signals representative of the sensed parameter and transmitting the signals out of the housing for analysis.

2. The sensing apparatus as recited in claim 1 wherein the housing comprises:

a generally flat base member having a first principal surface, a second principal surface and a first predetermined thickness, a first flange member extending from the second surface of the base member, the first flange member having a distal surface, an outer dimension and a second predetermined thickness, a generally flat cover member having a first principal surface, a second principal surface and a third predetermined thickness, the cover member having a dimension which is at least as great as the dimension of the first flange member, the second surface of the cover member engaging the distal surface of the first flange member to establish, with base member, the compartment, the first, second and third predetermined thicknesses, when combined, establishing the maximum thickness of the housing.

3. The sensing apparatus as recited in claim 2, wherein the base member is generally circular and has an axis, the first flange member is generally annular, has an axis and an outer circumference and is coaxial with the base member and the cover member is generally circular, has an axis and is coaxial with the base member.

4. The sensing apparatus as recited in claim 3, wherein the housing is sized and shaped to be received by a wafer holding assembly of the robot arm for movement of the sensing apparatus into and out of the chamber and to selected locations within the chamber for sensing the parameter.

5. The sensing apparatus as recited in claim 1, wherein the transmitter is of the FM type.

6. The sensing apparatus as recited in claim 1 further including:

a receiver located outside of the processing chamber for receiving signals from the transmitter and a monitor coupled to the receiver for displaying images representative of the received signals.

7. The sensing apparatus as recited in claim 1 further including a power source comprised of a rechargeable battery.

8. The sensing apparatus as recited in claim 7, wherein the battery is of the lithium ion type.

9. The sensing apparatus as recited in claim 7 further including a charging jack accessible from the outside of the housing for recharging the battery.

10. The sensing apparatus as recited in claim 7 further including an on/off switch for applying or removing power from the battery to other components within the housing period.

11. The sensing apparatus as recited in claim 10, wherein the on/off switch comprises a magnetically actuated reed switch accessible from the outside of the housing.

12. The sensing apparatus as recited in claim 1, wherein the sensor senses one of pressure, temperature, air content, humidity and spectrographic analysis.

* * * * *